(12) United States Patent  (10) Patent No.: US 8,633,469 B2
Nakamura (45) Date of Patent: Jan. 21, 2014

(54) GROUP III NITRIDE SEMICONDUCTOR LIGHT-EMITTING DEVICE

(71) Applicant: Toyoda Gosei Co., Ltd., Kiyosu (JP)

(72) Inventor: Ryo Nakamura, Kiyosu (JP)

(73) Assignee: Toyoda Gosei Co., Ltd., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 13/688,105

(22) Filed: Nov. 28, 2012

(65) Prior Publication Data

US 2013/0146839 A1 Jun. 13, 2013

(30) Foreign Application Priority Data

Dec. 9, 2011 (JP) ................. 2011-270029

(51) Int. Cl.
  *H01L 29/06* (2006.01)
(52) U.S. Cl.
  USPC ............ 257/15; 257/101; 257/E33.049
(58) Field of Classification Search
  USPC ............... 257/15, 101, E33.049
  See application file for complete search history.

(56) References Cited

U.S. PATENT DOCUMENTS

| 7,193,246 B1 | 3/2007 | Tanizawa et al. |
| 2003/0010993 A1 | 1/2003 | Nakamura et al. |
| 2007/0063207 A1 | 3/2007 | Tanizawa et al. |
| 2008/0149955 A1 | 6/2008 | Nakamura et al. |
| 2008/0191195 A1 | 8/2008 | Tanizawa et al. |
| 2009/0283795 A1* | 11/2009 | Miki et al. ............ 257/103 |
| 2012/0113658 A1* | 5/2012 | Sakai ............ 362/458 |
| 2012/0248459 A1* | 10/2012 | Sakano ............ 257/76 |
| 2013/0016751 A1* | 1/2013 | Takado et al. ........ 372/45.012 |

FOREIGN PATENT DOCUMENTS

| JP | 10-173231 A | 6/1998 |
| JP | 11-214746 A | 8/1999 |
| JP | 2000-232236 A | 8/2000 |

* cited by examiner

*Primary Examiner* — Trung Q Dang
(74) *Attorney, Agent, or Firm* — McGinn IP Law Group, PLLC

(57) ABSTRACT

A Group III nitride semiconductor light-emitting device includes a sapphire substrate; and an n contact layer, an n cladding layer, a light-emitting layer, a p cladding layer, and a p contact layer, each of the layers being formed of Group III nitride semiconductor, are sequentially deposited on the sapphire substrate. The n cladding layer includes two layers of a high impurity concentration layer and a low impurity concentration layer in this order on the n contact layer, and the low impurity concentration layer is in contact with the light-emitting layer. The low impurity concentration layer is a layer having a lower n-type impurity concentration than that of the high impurity concentration layer, which has an n-type impurity concentration of $1/1000$ to $1/100$ of the p-type impurity concentration of the p cladding layer and a thickness of 10 Å to 400 Å.

20 Claims, 3 Drawing Sheets

GROUP III NITRIDE SEMICONDUCTOR LIGHT-EMITTING DEVICE

BACKGROUND OF THE INVENTION

1. Field of the Invention

The present invention relates to a Group III nitride semiconductor light-emitting device which exhibits improved luminous efficiency without increasing the driving voltage, and more particularly to a Group III nitride semiconductor light-emitting device whose characteristic feature resides in a layer in contact with the n-side of a light-emitting layer.

2. Background Art

Japanese Patent Application Laid-Open (kokai) No. H10-173231 (Patent Document 1) discloses a method for improving the luminous efficiency of a Group III nitride semiconductor light-emitting device, in which in an n cladding layer a region closer to a light-emitting layer has a lower carrier concentration. This Patent Document 1 shows an example of an n cladding layer having a two-layer structure in which an n-GaN layer with a carrier concentration of $1 \times 10^{19}/cm^3$ and a thickness of 3.5 µm, and an n-GaN layer with a carrier concentration of $1 \times 10^{18}/cm^3$ and a thickness of 0.5 µm are deposited in this order on a substrate.

Japanese Patent Application Laid-Open (kokai) No. H11-214746 (Patent Document 2) discloses a Group III nitride semiconductor light-emitting device wherein a first nitride semiconductor layer, a second nitride semiconductor layer, and a third nitride semiconductor layer are formed between a substrate and a light-emitting layer, the layers being sequentially deposited on the substrate, and the third nitride semiconductor layer has an n-type impurity concentration of $1 \times 10^{17}/cm^3$ or less and a thickness of 10 nm to 150 nm. When the third nitride semiconductor layer has such an n-type impurity concentration, the crystallinity of the third nitride semiconductor layer is improved, and the crystallinity of the light-emitting layer formed thereon is also improved, thereby improving the luminous efficiency. When the third nitride semiconductor layer has a thickness within the above range, the driving voltage can be successfully reduced.

Japanese Patent Application Laid-Open (kokai) No. 2000-232236 (Patent Document 3) discloses a Group III nitride semiconductor light-emitting device wherein an n cladding layer is formed in contact with the n-side of a light-emitting layer and has a superlattice structure in which a first nitride semiconductor layer and a second nitride semiconductor layer are alternately and repeatedly deposited. This Patent Document describes that the n cladding layer has preferably a thickness of 25 Å to 1000 Å. When the thickness falls within such a range, the crystallinity can be improved, thereby improving the luminous efficiency. It is also described that the first and second nitride semiconductor layers may be doped with an n-type impurity, or undoped.

The mobility of electrons is greater than that of holes in the Group III nitride semiconductor due to lower effective mass than holes. Therefore, when the n-type impurity concentration of a layer in contact with the n-side of the light-emitting layer is increased, electron-hole pairs in the light-emitting layer are concentrated on the p-side and saturated, or electrons pass through the light-emitting layer, and overflow to the p-side.

On the contrary, even if the n-type impurity concentration of a layer in contact with the n-side of the light-emitting layer is reduced as in Patent Documents 1 to 3, electron and hole distribution in the light-emitting layer is unbalanced when the low impurity concentration layer is thick. As a result, holes pass through the light-emitting layer and overflow to the n-side, thereby leading to a problem that the luminous efficiency is reduced. Besides, when a layer in contact with the n-side of the light-emitting layer is undoped, the driving voltage increases.

SUMMARY OF THE INVENTION

In view of the foregoing, an object of the present invention is to provide a Group III nitride semiconductor light-emitting device which exhibits improved luminous efficiency without increasing the driving voltage.

In a first aspect of the present invention, there is provided a Group III nitride semiconductor light-emitting device having a light-emitting layer and a p cladding layer thereon, wherein a high impurity concentration layer formed in an opposite side to the p-cladding layer side of the light-emitting layer and doped with an n-type impurity, a low impurity concentration layer is formed in contact with the light-emitting layer between the high impurity concentration layer and the light emitting layer and has an n-type impurity concentration lower than that of the high impurity concentration layer, and the low impurity concentration layer has an n-type impurity concentration of $1/1000$ to $1/100$ of the p-type impurity concentration of the p cladding layer, and a thickness of 10 Å to 400 Å.

The low impurity concentration layer may be an n cladding layer. Also the high impurity concentration layer may also be an n cladding layer. The low or high impurity concentration layer may be newly formed separately from the n cladding layer. Moreover, the low impurity concentration layer and the high impurity concentration layer may have a superlattice structure, or may comprise a single layer or a plurality of layers not having a superlattice structure. In case of a superlattice structure, for example, a structure can be employed in which a plurality of layer units are repeatedly deposited, each layer unit including at least two layers made of InGaN undoped or doped with an n-type impurity and GaN undoped or doped with an n-type impurity.

The light-emitting layer or the p cladding layer may have any conventionally known structure. The light-emitting layer, for example, may have a MQW structure made of InGaN/GaN. The p cladding layer, for example, may have a superlattice structure made of p-InGaN/p-AlGaN or p-GaN/p-AlGaN, or a single layer made of p-AlGaN.

In the present invention, the n-type impurity concentrations of the high impurity concentration layer and the low impurity concentration layer or the p-type impurity concentration of the p cladding layer show the average concentration of each entire layer. Therefore, even if there is a concentration gradient in a thickness direction of the layer, or some of the layers do not satisfy the concentration range indicated in the present invention when the layer comprises a plurality of layers, it is acceptable as long as the average concentration of the entire layer satisfies the range indicated in the present invention.

Although Si is generally used as an n-type impurity, Ge, C and others can be used. Although Mg is generally used as a p-type impurity, Zn and others can be used.

Any n-type impurity concentration of the low impurity concentration layer may be used as long as it is lower than that of the high impurity concentration layer, and it falls within a range of $1/1000$ to $1/100$ of the p-type impurity concentration of the p cladding layer. Preferably, the low impurity concentration layer has an n-type impurity concentration of $1 \times 10^{17}/cm^3$ to $1 \times 10^{18}/cm^3$. Moreover, the p cladding layer preferably has a p-type impurity concentration of $1 \times 10^{19}/cm^3$ to $1 \times 10^{21}/cm^3$. Any n-type impurity concentration of the high impurity concentration layer may be used as long as it is higher than that of the low impurity concentration layer. Preferably, it is $1 \times 10^{18}/cm^3$ to $1 \times 10^{21}/cm^3$.

The low impurity concentration layer preferably has a thickness of 50 Å to 400 Å because it can further improve the luminous efficiency. More preferably, it is 150 Å to 350 Å.

A second aspect of the present invention is drawn to a specific embodiment of the Group III nitride semiconductor light-emitting device according to the first aspect of the invention, wherein the low impurity concentration layer has an n-type impurity concentration of $1 \times 10^{17}/cm^3$ to $1 \times 10^{18}/cm^3$.

A third aspect of the present invention is drawn to a specific embodiment of the Group III nitride semiconductor light-emitting device according to the first or second aspect of the invention, wherein the low impurity concentration layer has a thickness of 200 Å to 400 Å.

A fourth aspect of the present invention is drawn to a specific embodiment of the Group III nitride semiconductor light-emitting device according to the third aspect of the invention, wherein the low impurity concentration layer has a thickness of 150 Å to 350 Å.

A fifth aspect of the present invention is drawn to a specific embodiment of the Group III nitride semiconductor light-emitting device according to any of the first to fourth aspects of the invention, wherein the low impurity concentration layer has a superlattice structure.

A sixth aspect of the present invention is drawn to a specific embodiment of the Group III nitride semiconductor light-emitting device according to the fifth aspect of the invention, wherein the high impurity concentration layer and the low impurity concentration layer are an n cladding layer having a superlattice structure.

A seventh aspect of the present invention is drawn to a specific embodiment of the Group III nitride semiconductor light-emitting device according to any of the fifth to sixth aspects of the invention, wherein the superlattice structure is a structure in which a plurality of layer units are repeatedly deposited, each layer unit including at least two layers made of InGaN undoped or doped with an n-type impurity and GaN undoped or doped with an n-type impurity.

According to the present invention, distribution of electron-hole pairs is suppressed from shifting to the p-side or n-side so that a balanced distribution of electrons and holes can be achieved in the light-emitting layer. Thus, overflow of holes to the n-side as well as overflow of electrons to the p-side can be suppressed, thereby improving the luminous efficiency. Moreover, in the present invention, the layer in contact with the n-side of the light-emitting layer is a low impurity concentration layer doped with an n-type impurity, that is, is not an undoped layer. Therefore, the driving voltage is not increased compared to the conventional Group III nitride semiconductor light-emitting device.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Specific embodiments of the present invention will next be described with reference to the drawings. However, the present invention is not limited to the embodiments.

Embodiment 1

Figure 1:
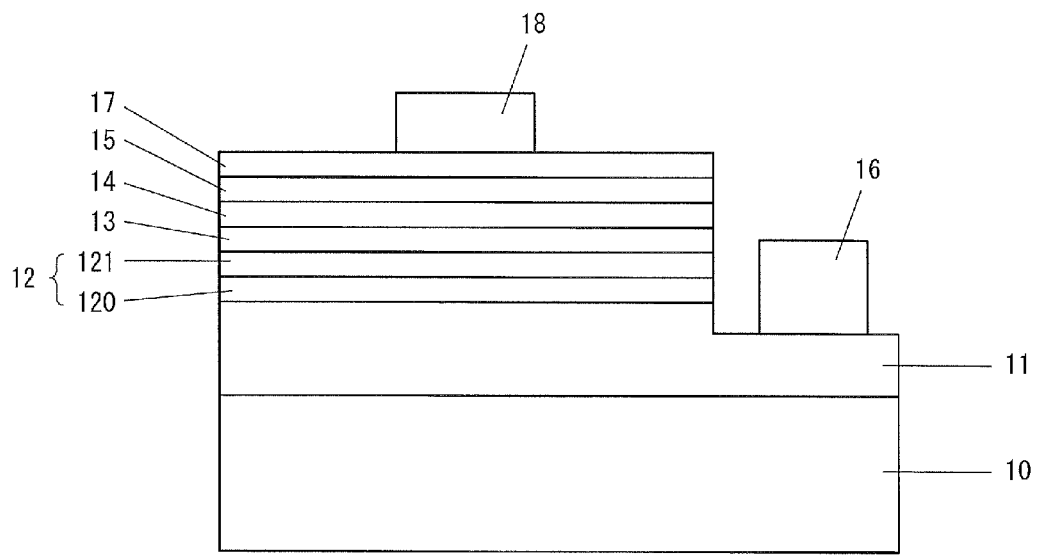
FIG. 1 shows the structure of a Group III nitride semiconductor light-emitting device according to Embodiment 1.

FIG. 1 shows the structure of a Group III nitride semiconductor light-emitting device according to Embodiment 1. The Group III nitride semiconductor light-emitting device according to Embodiment 1 includes a sapphire substrate 10; and an n contact layer 11, an n cladding layer 12, a light-emitting layer 13, a p cladding layer 14, and a p contact layer 15, each of the layers being formed of Group III nitride semiconductor, are sequentially deposited on the sapphire substrate 10. A trench having a depth extending from the top surface (a surface opposite to the p cladding layer side) of the p contact layer 15 to the n contact layer 11 is formed. On the n contact layer 11 exposed on the bottom of the trench, there is provided an n-electrode 16. An ITO transparent electrode 17 is formed on almost the entire surface other than the region provided with the trench of the surface of the p contact layer 15, and a p-electrode 18 is formed on the transparent electrode 17.

The sapphire substrate 10 is a sapphire substrate having a c-plane main surface. A substrate having an a-plane main surface can also be used. A SiC, Si, ZnO, spinel, or GaN substrate can be used other than the sapphire substrate. Moreover, a concave and convex configuration such as a stripe pattern or a dot pattern may be formed on the surface of the sapphire substrate 10 on which a Group III nitride semiconductor layer is deposited. This can improve the light extraction efficiency.

The n contact layer 11 is formed of n-GaN having a Si concentration of $1 \times 10^{18}/cm^3$ or more. The n contact layer 11 may comprise a plurality of layers having different Si concentrations. The contact resistance to the n-electrode 16 can be further reduced without deteriorating the crystallinity of the n contact layer 11 by increasing the Si concentration of some of the layers which is in contact with the n-electrode 16.

The n cladding layer 12 has a superlattice structure in which a plurality of layer units are repeatedly deposited, each layer unit including undoped InGaN/undoped GaN/Si doped n-GaN (three layers of an undoped InGaN layer, an undoped GaN layer, and a Si doped n-GaN layer are sequentially deposited on the sapphire substrate 10, symbol "/" means a layered structure, and A/B means a layered structure in which B was formed after A was formed. Hereinafter, the same is applied.) The undoped InGaN layer has a thickness of 1.6 nm, the undoped GaN layer has a thickness of 1.6 nm, the n-GaN layer has a thickness of 1.6 nm, and the total film thickness of one layer unit is 4.8 nm. Also, the total thickness of the n cladding layer 12 is 72 nm.

The n cladding layer 12 comprises two layers of a high impurity concentration layer 120 and a low impurity concentration layer 121 formed in this order on the n contact layer 11 as shown in FIG. 1. Of the above plurality of layer units constituting the superlattice structure of the n cladding layer 12, several layer units in contact with the light-emitting layer 13 are the low impurity concentration layer 121, and the remaining layer units are the high impurity concentration layer 120. The low impurity concentration layer 121 has a lower Si concentration than that of the high impurity concentration layer 120. The high impurity concentration layer 120 has a Si concentration of $1 \times 10^{18}/cm^3$, and the low impurity concentration layer 121 has a Si concentration of $2.5 \times 10^{17}/cm^3$. The Si concentrations of the high impurity concentration layer 120 and the low impurity concentration layer 121 are the average concentration of each entire layer. Hereinafter, the same is applied.

The Si concentration of the low impurity concentration layer 121 is not limited to the above range as long as it falls within a range of 1/1000 to 1/100 of the Mg concentration of the p cladding layer 12. When the Si concentration of the low impurity concentration layer 121 falls within this range, a balanced distribution of electrons and holes can be achieved, thereby improving the luminous efficiency. The Si concentration of the low impurity concentration layer 121 more preferably satisfies the range of $1 \times 10^{17}/cm^3$ to $1 \times 10^{18}/cm^3$.

The low impurity concentration layer 121 may have such a thickness that a sufficient amount of Si is contained in the crystal and Si acts as an n-type impurity, which is 10 Å or more. However, if the thickness is too large, the luminous efficiency is deteriorated. Therefore, the thickness does not exceed 400 Å. That is, the thickness of the low impurity concentration layer 121 may fall within a range of 10 Å to 400 Å. More preferably, the thickness is between 50 Å and 400 Å, and further preferably, it is between 150 Å and 350 Å.

The Si concentration of the high impurity concentration layer 120 is not limited to the above. Any Si concentration is acceptable as long as it is higher than that of the low impurity concentration layer 121. Preferably, the Si concentration is between $1 \times 10^{18}/cm^3$ and $1 \times 10^{21}/cm^3$. When the Si concentration is lower than $1 \times 10^{18}/cm^3$, reducing the resistance of the high impurity concentration layer 120 is not sufficiently achieved. When the Si concentration is higher than $1 \times 10^{21}/cm^3$, the crystallinity is deteriorated.

An ESD layer may be formed between the n contact layer 11 and the n cladding layer 12 to improve the electrostatic breakdown voltage of the device. For example, the ESD layer has a three-layer structure comprising a first ESD layer, a second ESD layer, and a third ESD layer, the layers being sequentially deposited on the n contact layer 11. The first ESD layer has pits (pit density: $1 \times 10^8/cm^2$ or less) on the surface at the light-emitting layer 13 side thereof. The first ESD layer is formed of GaN having a thickness of 200 nm to 1000 nm, and a Si concentration of $1 \times 10^{16}/cm^3$ to $5 \times 10^{17}/cm^3$. The second ESD layer has pits (pit density: $2 \times 10^8/cm^2$ or more) on the surface at the light-emitting layer 13 side thereof. The second ESD layer is formed of GaN having a thickness of 50 nm to 200 nm, and a carrier concentration of $5 \times 10^{17}/cm^3$ or less. The third ESD layer is formed of GaN having a characteristic value, as defined by the product of Si concentration ($/cm^3$) and thickness (nm), of $0.9 \times 10^{20}$ to $3.6 \times 10^{20}$ ($nm/cm^3$). Such a structure of the ESD layer can increase electrostatic breakdown voltage, luminous efficiency, and reliability, and reduce the current leakage.

The light-emitting layer 13 has a MQW structure in which an undoped InGaN well layer and an undoped AlGaN barrier layer are alternately deposited in a repeated manner. The light-emitting layer 13 is in contact with and on the low impurity concentration layer 121. A capping layer made of AlGaN having an Al composition ratio not larger than that of the barrier layer may be formed between the well layer and the barrier layer at the same growth temperature as employed for the well layer. When such a capping layer is provided, release of In from the well layer is prevented during heating for formation of the barrier layer, thereby improving the luminous efficiency. A layer made of undoped GaN and undoped AlGaN may be formed between the light-emitting layer 13 and the p cladding layer 14 to prevent diffusion of Mg from the p cladding layer 14 to the light-emitting layer 13.

The p cladding layer 14 has a superlattice structure in which a plurality of layer units are repeatedly deposited, each layer unit including a p-AlGaN layer having a thickness of 2 nm and a Mg concentration of $1 \times 10^{20}/cm^3$, and a p-InGaN layer having a thickness of 2 nm and a Mg concentration of $1 \times 10^{20}/cm^3$. However, the initial layer of the p cladding layer 14, which is in contact with the light-emitting layer 13, is the p-InGaN layer, and the final layer of the p cladding layer 14, which is in contact with the p contact layer 15, is the p-AlGaN layer. The average Mg concentration of the entire p cladding layer 14 is $1 \times 10^{20}/cm^3$. 1/400 of this average Mg concentration is equal to the average Si concentration of the low impurity concentration layer 121.

The p cladding layer 14 may have a superlattice structure other than the above, for example, of p-GaN/p-AlGaN, or a structure other than the superlattice structure, for example, a single p-AlGaN layer or a plurality of layers not having a superlattice structure. The average Mg concentration of the p cladding layer 14 is not necessarily the above value, but is preferably between $1 \times 10^{19}/cm^3$ and $1 \times 10^{21}/cm^3$. When the Mg concentration is lower than $1 \times 10^{19}/cm^3$, reducing the resistance of the p cladding layer 14 is not sufficiently achieved. When the Mg concentration is higher than $1 \times 10^{21}/cm^3$, the crystallinity is deteriorated.

The p contact layer 15 is formed of p-GaN having a thickness of 10 nm and a Mg concentration of $1.0 \times 10^{21}/cm^3$. The p contact layer 15 may comprise a plurality of layers having different Mg concentrations to achieve both improvement of the crystallinity and reduction of the contact resistance to the transparent electrode 17. For example, the p contact layer 15 may have a three-layer structure in which a first p contact layer formed of GaN having a Mg concentration of $1 \times 10^{19}/cm^3$ to $3 \times 10^{19}/cm^3$ and a thickness of 320 Å, a second p contact layer formed of GaN having a Mg concentration of $4 \times 10^{19}/cm^3$ to $6 \times 10^{19}/cm^3$ and a thickness of 320 Å, and a third p contact layer formed of GaN having a Mg concentration of $1 \times 10^{20}/cm^3$ to $2 \times 10^{20}/cm^3$ and a thickness of 80 Å are sequentially deposited on the p cladding layer 14. The third p contact layer in contact with the transparent electrode 17 may be formed of InGaN instead of GaN. When using InGaN, the work function of the p contact layer 15 is closer to that of the transparent electrode 17, thereby the contact resistance can be further reduced. A concave and convex configuration may be formed on the top surface of the p contact layer 15. This improves the light extraction efficiency, and the contact area with the ITO electrode 17 increases, thereby the contact resistance can be further reduced.

The transparent electrode 17 made of ITO is formed on almost the entire surface of the p contact layer 15. A transparent oxide conductive material such as ICO (cerium-doped indium oxide) or IZO (zinc-doped indium oxide) other than ITO, or a metal thin film such as Au can be used as the transparent electrode 17.

The n-electrode 16 and the p-electrode 18 may have a structure including a pad to which a wire is bonded, and a wiring pattern extending (e.g. in a grid-like pattern, a comb teeth pattern, or a radial pattern) on each surface of the n contact layer 11 and the transparent electrode 17 for diffusing a current, which is connected to the pad.

In the Group III nitride semiconductor light-emitting device according to Embodiment 1 as described above, the low impurity concentration layer 121 having a lower Si concentration than that of the high impurity concentration layer 120 is introduced as a layer in contact with the n-side of the light-emitting layer 13. The Si concentration is between $1/1000$ and $1/100$ of the Mg concentration of the p cladding layer 12, and the thickness falls within a range of 10 Å to 400 Å. When such a low impurity concentration layer 121 is introduced, the amount of electrons supplied from the n-side layers to the light-emitting layer 13 decreases, and the distribution of electron-hole pairs which are concentrated on the p-side of the light-emitting layer 13 due to the difference between electron and hole mobilities shifts to the n-side of the light-emitting layer 13. Therefore, the distribution of electron-hole pairs shifts near the center of thickness of the light-emitting layer 13, and electrons can be suppressed from overflowing to the p-side. When the Si concentration and thickness of the low impurity concentration layer 121 fall within the above range, holes can be suppressed from overflowing to the n-side due to concentrated distribution of electron-hole pairs on the n-side of the light-emitting layer 13. As a result, a balanced distribution of electrons and holes is achieved in the light-emitting layer 13, thereby improving the luminous efficiency of the Group III nitride semiconductor light-emitting device according to Embodiment 1. Moreover, the layer in contact with the n-side of the light-emitting layer 13 is not an undoped layer but the low impurity concentration layer 121 doped with the above specified amount of Si. Therefore, the driving voltage is not increased compared to the conventional Group III nitride semiconductor light-emitting device.

Next will be described a method for producing the Group III nitride semiconductor light-emitting device according to Embodiment 1.

Firstly, a sapphire substrate 10 was prepared and heated in a hydrogen atmosphere for cleaning, to thereby remove deposits from the surface of the sapphire substrate 10. Then, an AlN buffer layer (not illustrated) was formed on the sapphire substrate 10 at 400° C. by MOCVD. Thereafter, on the buffer layer, an n contact layer 11, an n cladding layer 12, a light-emitting layer 13, a p cladding layer 14, and a p contact layer 15 were sequentially formed by MOCVD. The gases employed were as follows: ammonia gas ($NH_3$) as a nitrogen source; trimethylgallium ($Ga(CH_3)_3$, hereinafter may be referred to as "TMG") as a Ga source; trimethylindium ($In(CH_3)_3$, hereinafter may be referred to as "TMI") as an In source; trimethylaluminum ($Al(CH_3)_3$, hereinafter may be referred to as "TMA") as an Al source; silane ($SiH_4$) as an n-type dopant gas; cyclopentadienylmagnesium ($Mg(C_5H_5)_2$, hereinafter may be referred to as "$Cp_2Mg$") as a p-type dopant gas; and hydrogen ($H_2$) and nitrogen ($N_2$) as a carrier gas.

Figure 2A:
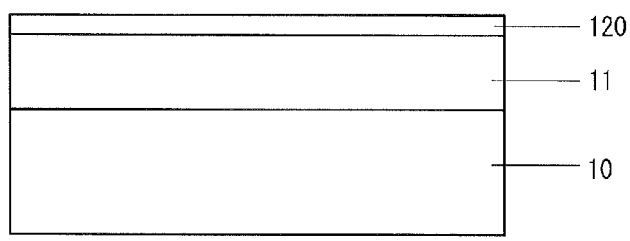
FIGS. 2A and 2B are sketches showing a process for forming an n cladding layer 12.
Figure 2B:
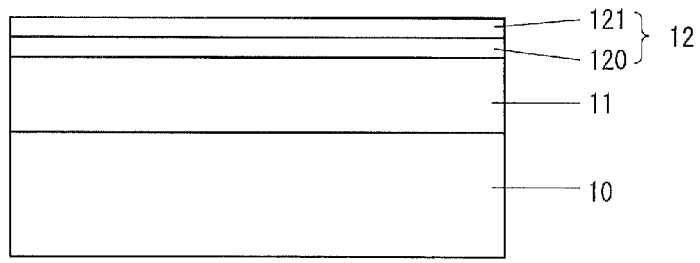

The n cladding layer 12 was formed as follows: a high impurity concentration layer 120 having a superlattice structure was formed by repeatedly depositing a plurality of layer units on the n contact layer 11, each layer unit comprising undoped InGaN/undoped GaN/n-GaN (FIG. 2A). Next, a superlattice structure was formed in the same way except for reducing the supply amount of silane when forming the n-GaN layer of the undoped InGaN/undoped GaN/n-GaN layer unit by repeatedly depositing a plurality of layer units, each layer unit comprising undoped InGaN/undoped GaN/n-GaN. Thus, a low impurity concentration layer 121 having a lower Si concentration than that of the high impurity concentration layer 120 was formed (FIG. 2B). The Si concentration of the low impurity concentration layer 121 was controlled by the Si doping amount in the n-GaN layer of each layer unit so that the average Si concentration of the entire low impurity concentration layer 121 was $2.5 \times 10^{17}/cm^3$. The thickness of the low impurity concentration layer 121 was controlled by changing the number of undoped InGaN/undoped GaN/n-GaN layer units. The thickness of the low impurity concentration layer 121 may be controlled by changing the thickness of each layer of the undoped InGaN/undoped GaN/n-GaN layer unit. Through the above processes, the n cladding layer 12 was formed.

After the p contact layer 15 was formed, a trench with a depth extending from the surface of the p contact layer 15 to the n contact layer 11 was formed by dry etching a specific portion of the p contact layer 15. Then, an ITO transparent electrode 17 was formed on almost the entire top surface of the p contact layer 15. A p-electrode 18 was formed on the transparent electrode 17, and an n-electrode 16 was formed on the surface of the n contact layer 11 exposed at the bottom of the trench. Through the above, the Group III nitride semiconductor light-emitting device according to Embodiment 1 as shown in FIG. 1 was produced.

Next will be described the measurement results of light output and driving voltage of the Group III nitride semiconductor light-emitting device according to Embodiment 1.

Figure 3:
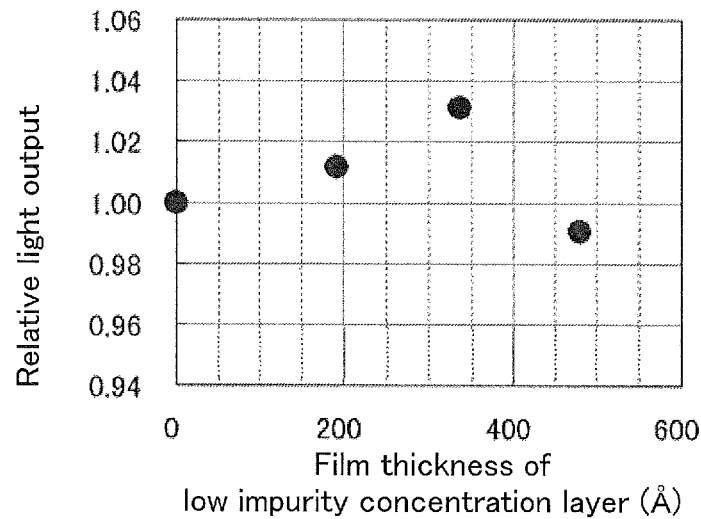
FIG. 3 is a graph showing the relationship between thickness and light output strength of low impurity concentration layer 121.

FIG. 3 is a graph showing the relative light output strength of the Group III nitride semiconductor light-emitting device according to Embodiment 1 when the thickness of the low impurity concentration layer 121 was changed. The thickness of the low impurity concentration layer 121 was changed by changing the number of layer units of the superlattice structure. However, the thickness of the entire n cladding layer 12 was unchanged by changing the thickness ratio between the high impurity concentration layer 120 and the low impurity concentration layer 121 which constitute the cladding layer 12. The relative light output strength shown on the vertical axis of the graph was normalized by taking as 1, the light output when the low impurity concentration layer 121 is not provided in the light-emitting device (the entire n cladding layer 12 is the high impurity concentration layer 120).

As shown in FIG. 3, when the low impurity concentration layer 121 has a thickness of about 200 Å, the relative light output is about 1.01. When the low impurity concentration layer 121 has a thickness of about 340 Å, the relative light output is about 1.03. When the low impurity concentration layer 121 has a thickness of about 480 Å, the relative light output is about 0.99. In terms of balanced distribution of electrons and holes in the light-emitting layer 13, which is the purpose for introducing the low impurity concentration layer 121, the following is assumed. As the thickness of the low impurity concentration layer 121 increases, the distribution of electrons and holes shifts to the n-side of the light-emitting layer 13, and the overflow of electrons to the p-side decreases. Thereby the distribution balance is improved, and the light output gradually increases. When the film thickness exceeds a specified value, the distribution of electrons and holes extremely shifts to the n-side of the light-emitting layer 13, and an overflow of holes occurs at the n-side. Thereby, the light output starts to decrease and keeps decreasing. The graph of FIG. 3 almost meets the above assumption, which supports that the assumption is appropriate.

From the above assumption and FIG. 3, the luminous efficiency of the Group III nitride semiconductor light-emitting device according to Embodiment 1 is considered to be improved when the low impurity concentration layer 121 contains at least a sufficient amount of Si in the crystal and has such thickness that Si acts as an n-type impurity, which is 10 Å. The upper limit thickness of the low impurity concentration layer 121 is such a thickness that the relative light output is larger than 1 and is in a section where the luminous efficiency is turned from an increase to a decrease, which is 400 Å. Therefore, the thickness of the low impurity concentration layer 121 is preferably between 10 Å and 400 Å. More preferably to improve the luminous efficiency, the thickness is between 50 Å and 400 Å from FIG. 3, and further preferably it is between 150 Å and 350 Å. It is most preferable between 180 Å and 340 Å.

Figure 4:
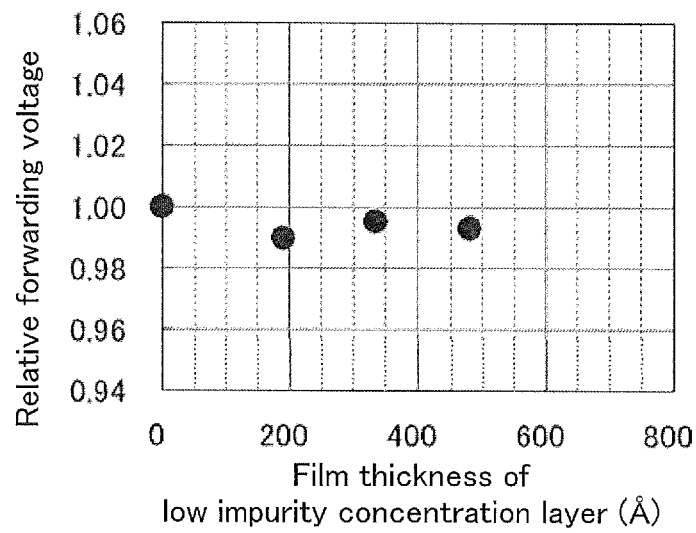
FIG. 4 is a graph showing the relationship between thickness of the low impurity concentration layer 121 and forward voltage of the Group III nitride semiconductor light-emitting device according to Embodiment 1.

FIG. 4 is a graph showing the relationship between thickness of the low impurity concentration layer 121 and relative forward voltage of the light-emitting device. Whereas the thickness of the low impurity concentration layer 121 was changed by changing the number of layer units of the superlattice structure same as the case of FIG. 3, the thickness of the entire n cladding layer 12 was not changed. The relative forward voltage was normalized by taking as 1, the forward voltage when a 20 mA forward current was supplied to the light-emitting device in which the entire n cladding layer 12 is the high impurity concentration layer 120 without providing the low impurity concentration layer 121.

As is clear from FIG. 4, the driving voltage does not increase even when the low impurity concentration layer 121 is introduced. It is also clear that there is almost no change in the driving voltage even when the thickness of the low impurity concentration layer 121 is changed.

Figure 5:
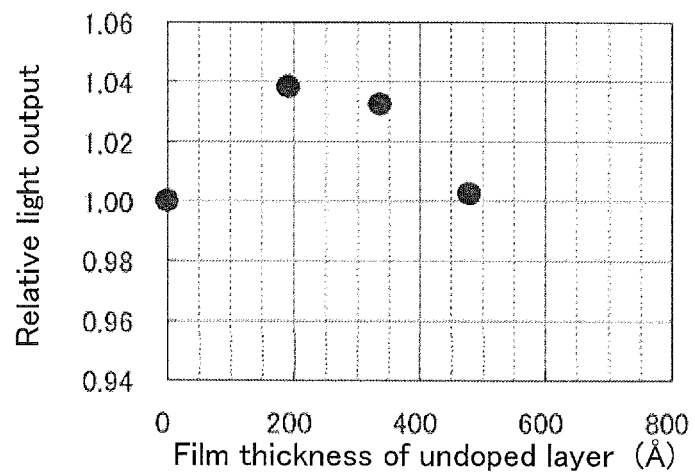
FIG. 5 is a graph showing the relationship between thickness of an undoped layer and light output strength of a light-emitting device according to a comparative example.
Figure 6:
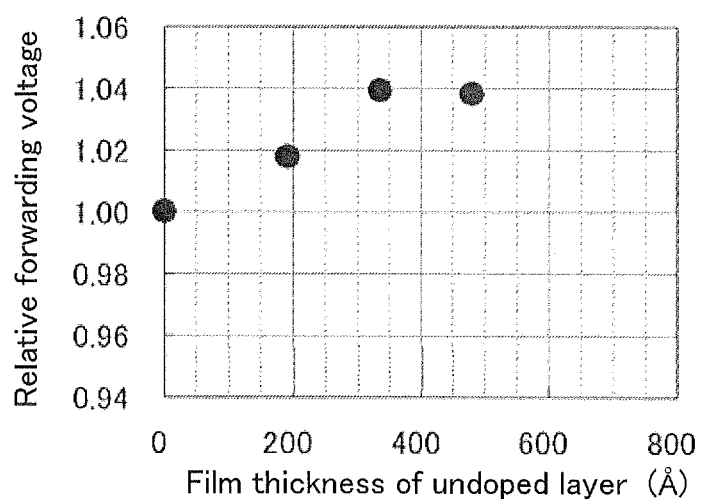
FIG. 6 is a graph showing the relationship between thickness of an undoped layer and forward voltage of a light-emitting device according to a comparative example.

For comparison, in the Group III nitride semiconductor light-emitting device wherein an undoped layer was introduced instead of the low impurity concentration layer 121, the relative light output and the relative forward voltage were measured when the thickness of the undoped layer was changed same as in FIGS. 3 and 4. FIG. 5 is a graph showing the relationship between thickness of the undoped layer and the relative light output of the light-emitting device. FIG. 6 is a graph showing the relationship between thickness the undoped layer and the relative forward voltage of the light-emitting device.

As is observed from FIG. 5, the luminous efficiency can be improved by introducing the undoped layer having a thickness of about 100 Å to 400 Å. However, on the other hand, it is observed from FIG. 6 that the driving voltage increases more when the undoped layer is introduced than when the undoped layer is not introduced.

In Embodiment 1, the high impurity concentration layer 120 or the low impurity concentration layer 121 has a superlattice structure, but it is not limited to such structure. For example, the high impurity concentration layer 120 or the low impurity concentration layer 121 may comprise a single layer or a plurality of layers not having a superlattice structure. However, when the low impurity concentration layer 121 in contact with the n-side of the light-emitting layer 13 has a superlattice structure, the crystallinity of the low impurity concentration layer 121 is improved, and the crystallinity of the light-emitting layer 13 formed thereon is also improved, thereby further improving the luminous efficiency. Moreover, in Embodiment 1, the low impurity concentration layer 121 is a part of the n cladding layer 12, but it is not limited to such structure. The low impurity concentration layer 121 may be any layer as long as it is in contact with the n-side of the light-emitting layer 13. For example, the low impurity concentration layer 121 may be a layer newly formed between the light-emitting layer 13 and the n cladding layer 12.

The Group III nitride semiconductor light-emitting device according to Embodiments is of a face-up type. However, the present invention is not limited thereto, and may be applied to the Group III nitride semiconductor light-emitting device having any conventionally known structure. For example, the present invention may be applied to a flip-chip type device or a device having a vertical conductive structure obtained by using a conductive substrate or removing a substrate by a laser lift-off technique.

The Group III nitride semiconductor light-emitting device of the present invention can be employed in, for example, an illumination apparatus or a display apparatus.

What is claimed is:

1. A Group III nitride semiconductor light-emitting device having a light-emitting layer and a p cladding layer on the light-emitting layer, the device comprising:
    a high impurity concentration layer formed in an opposite side to the p-cladding layer side of the light-emitting layer and doped with an n-type impurity;
    a low impurity concentration layer formed in contact with the light-emitting layer between the high impurity concentration layer and the light-emitting layer, the low impurity concentration layer having an n-type impurity concentration lower than an n-type impurity concentration of the high impurity concentration layer; and
    wherein the low impurity concentration layer has an n-type impurity concentration of $1/1000$ to $1/100$ of the p-type impurity concentration of the p cladding layer, and a thickness of 10 Å to 400 Å.

2. The Group III nitride semiconductor light-emitting device according to claim 1, wherein the low impurity concentration layer has an n-type impurity concentration of $1 \times 10^{17}/cm^3$ to $1 \times 10^{18}/cm^3$.

3. The Group III nitride semiconductor light-emitting device according to claim 1, wherein the low impurity concentration layer has a thickness of 50 Å to 400 Å.

4. The Group III nitride semiconductor light-emitting device according to claim 2, wherein the low impurity concentration layer has a thickness of 50 Å to 400 Å.

5. The Group III nitride semiconductor light-emitting device according to claim 3, wherein the low impurity concentration layer has a thickness of 150 Å to 350 Å.

6. The Group III nitride semiconductor light-emitting device according to claim 4, wherein the low impurity concentration layer has a thickness of 150 Å to 350 Å.

7. The Group III nitride semiconductor light-emitting device according to claim 1, wherein the low impurity concentration layer has a superlattice structure.

8. The Group III nitride semiconductor light-emitting device according to claim 2, wherein the low impurity concentration layer has a superlattice structure.

9. The Group III nitride semiconductor light-emitting device according to claim 3, wherein the low impurity concentration layer has a superlattice structure.

10. The Group III nitride semiconductor light-emitting device according to claim 5, wherein the high impurity concentration layer and the low impurity concentration layer are an n cladding layer having a superlattice structure.

11. The Group III nitride semiconductor light-emitting device according to claim 1, wherein the high impurity concentration layer and the low impurity concentration layer are an n cladding layer having a superlattice structure.

12. The Group III nitride semiconductor light-emitting device according to claim 2, wherein the high impurity concentration layer and the low impurity concentration layer are an n cladding layer having a superlattice structure.

13. The Group III nitride semiconductor light-emitting device according to claim 3, wherein the high impurity concentration layer and the low impurity concentration layer are an n cladding layer having a superlattice structure.

14. The Group III nitride semiconductor light-emitting device according to claim 5, wherein the high impurity concentration layer and the low impurity concentration layer are an n cladding layer having a superlattice structure.

15. The Group III nitride semiconductor light-emitting device according to claim 7, wherein the superlattice structure comprises a plurality of layer units repeatedly deposited, each layer unit including at least two layers made of InGaN undoped or doped with an n-type impurity and GaN undoped or doped with an n-type impurity.

16. The Group III nitride semiconductor light-emitting device according to claim 8, wherein the superlattice structure comprises a plurality of layer units repeatedly deposited, each layer unit including at least two layers made of InGaN undoped or doped with an n-type impurity and GaN undoped or doped with an n-type impurity.

17. The Group III nitride semiconductor light-emitting device according to claim 11, wherein the superlattice structure comprises a plurality of layer units repeatedly deposited, each layer unit including at least two layers made of InGaN undoped or doped with an n-type impurity and GaN undoped or doped with an n-type impurity.

18. The Group III nitride semiconductor light-emitting device according to claim 12, wherein the superlattice structure comprises a plurality of layer units repeatedly deposited, each layer unit including at least two layers made of InGaN undoped or doped with an n-type impurity and GaN undoped or doped with an n-type impurity.

19. The Group III nitride semiconductor light-emitting device according to claim 13, wherein the superlattice structure comprises a plurality of layer units repeatedly deposited, each layer unit including at least two layers made of InGaN undoped or doped with an n-type impurity and GaN undoped or doped with an n-type impurity.

20. The Group III nitride semiconductor light-emitting device according to claim 14, wherein the superlattice structure comprises a plurality of layer units repeatedly deposited, each layer unit including at least two layers made of InGaN undoped or doped with an n-type impurity and GaN undoped or doped with an n-type impurity.

* * * * *